United States Patent
Ross

(10) Patent No.: US 6,302,709 B1
(45) Date of Patent: Oct. 16, 2001

(54) MULTIPLE FUNCTION HIGH CURRENT INTERCONNECT WITH INTEGRATED BUS BAR

(75) Inventor: Stanton W. Ross, Simi Valley, CA (US)

(73) Assignee: Power-One, Inc., Camarillo, CA (US)

( * ) Notice: Subject to any disclaimer, the term of this patent is extended or adjusted under 35 U.S.C. 154(b) by 0 days.

(21) Appl. No.: 09/587,702

(22) Filed: Jun. 5, 2000

(51) Int. Cl.[7] ....................................................... H05K 1/00
(52) U.S. Cl. .............................. 439/78; 439/947; 439/907
(58) Field of Search ............................... 439/78, 212, 949, 439/80, 81, 82, 83, 947, 907, 723, 724, 721, 608; 363/146

(56) References Cited

U.S. PATENT DOCUMENTS

| | | | |
|---|---|---|---|
| 3,340,497 | * 9/1967 | Balint | 439/872 |
| 3,775,733 | * 11/1973 | Ege | 439/724 |
| 4,002,388 | 1/1977 | Menocal | 339/22 |
| 4,332,430 | * 6/1982 | Clark | 439/78 |
| 4,585,285 | 4/1986 | Martens | 339/176 C |
| 4,694,123 | 9/1987 | Massey | 174/117 FF |
| 4,721,471 | 1/1988 | Mueller | 439/78 |
| 4,824,380 | 4/1989 | Matthews | 439/78 |
| 4,867,696 | 9/1989 | Demler, Jr. et al. | 439/212 |
| 4,954,090 | 9/1990 | Shimochi | 439/76 |
| 5,322,445 | * 6/1994 | Ozaki et al. | 439/212 |
| 5,474,475 | * 12/1995 | Yamaguchi | 439/621 |
| 5,624,269 | * 4/1997 | Kanamori | 439/83 |
| 6,024,589 | 2/2000 | Hahn, IV et al. | 439/212 |
| 6,026,916 | * 5/2000 | Gladd et al. | 439/751 |

* cited by examiner

Primary Examiner—Gary Paumen
Assistant Examiner—Ross Gushi
(74) Attorney, Agent, or Firm—O'Melveny & Myers LLP

(57) ABSTRACT

A bus bar with integrated quick-disconnect terminals for distributing electrical current from a power supply or other electronic component is disclosed. The bus bar and terminals are comprised of a single piece of copper alloy or other suitable bus bar material. The quick-disconnect terminals are blades configured to connect to industry standard receptacles. The bus bar additionally includes integral threaded inserts or other alternate means to provide direct attachment of lugs or other terminals using threaded fasteners, and pins for electrical engagement with power and ground traces on a printed circuit board.

21 Claims, 3 Drawing Sheets

MULTIPLE FUNCTION HIGH CURRENT INTERCONNECT WITH INTEGRATED BUS BAR

BACKGROUND OF THE INVENTION

1. Field of the Invention

The present invention relates to high-current, electrical quick-disconnect terminals and bus bars for distributing power from and to printed circuit boards, and more particularly, to such terminals and bus bars for electronic power supplies.

2. Description of Related Art

Bus bars are used for distributing electrical power from and to the power planes and ground planes of printed circuit boards. Such bus bars are fastened or soldered to an exposed portion of the ground plane or power plane of the circuit board, sometimes using plated through holes. Typically, bus bars include plated through holes for attaching ring terminals, or similar terminals, using threaded fasteners.

Power supplies are often used to supply power to numerous other components which together comprise a system, such as a computer network system. Thus, numerous power and ground wires connected to numerous other components may be connected to a single power supply. Additionally, wires connected to power supplies are disturbed relatively frequently, as components of the connected system are changed during system reconfigurations or for servicing.

Prior art power supplies do not provide an interconnect that is capable of handling multiple styles of connectors using a single, compact part mounted on the power supply. Users of power supplies currently use a wide variety of connectors and terminal devices to connect to power supplies. Power supplies must be manufactured to accommodate a variety of such connectors. At the same time, however, it is desirable to build a standard version of a power supply that does not require assembly of different interconnect components for different users, to reduce inventory and assembly costs.

Connections to prior art power supplies are also limited by heating caused by electrical contact resistance. Connections to power supplies in general operate at relatively high current levels, making them especially prone to heating from electrical resistance. This is particularly true in view of a trend towards lower voltage requirements, e.g., 3.3 volts and lower, for many modern electronic components. At these relatively low voltage levels, electrical currents are correspondingly higher when providing the same total power levels. Voltage drops in power supply interconnections will double and triple when current levels double and triple if not accompanied by a corresponding reduction in the electrical resistance of the interconnection system. In addition, voltage drops considered acceptable in a 12 or even 5 volt system become unacceptable in an even lower voltage system since they become a very high percentage of the delivered voltage. For example, a 50 amp power supply with an electrical interconnect having a 10 milliohm connective resistance results in a 0.5 volt drop at the interconnection. In a 1.8 voltage power supply this would be unacceptable. Consequently, reducing the electrical resistance of the connection to the power supply has become more important.

Heating from electrical resistance also imposes design constraints on prior art interconnects for power supplies, limiting the current capacity of each interconnect and increasing the number of connections that must be made to a single power supply just to carry the primary voltage. This in turn has hindered design of more compact power supplies by requiring more volume and panel space to accommodate the additional interconnections.

Prior art power supplies typically utilize a bus bar to distribute power from one location to another on a printed circuit board within an electronic system such as a power supply. Connections for power distribution to external electronic devices are typically made using flag terminals, other types of terminal devices, or other commercially available electrical connectors, with one side attached directly to the printed circuit board (PCB) usually by soldering. Cabling leading to external devices is typically connected to the mating halves of the above mentioned connectors. For example, quick-disconnect receptacles or ring lugs are crimped or otherwise attached to the wire cabling. Thus, in a typical prior art power supply, the interconnect resistance between the bus bar and the external cable wiring includes resistance from the bus bar-PCB connection resistance, the PCB trace resistance, and the PCB to terminal resistance, in addition to the connective resistance between the wire, the wire connector, and the terminal. A further disadvantage of prior art power supplies is that the terminal connectors require more space on the panel of the power supply than is necessary to efficiently accommodate external connections.

In some configurations, an external wire is connected directly to a bus bar using a threaded fastener. While reducing output power interconnection resistance, this configuration does not provide for use of commonly used quick-disconnect connectors to connect to the power supply. Quick-disconnect connectors are friction-fit devices that provide a convenient, removable electrical connection without the use of threaded fasteners or solder, and are considered a practical necessity by many users.

Therefore, objects of the present invention are to provide an integrated high-current interconnect and bus bar that provides for less electrical resistance, higher current capacity, cooler operation, interconnect capability for quick-disconnect connectors, and more compact design than afforded by prior art interconnects and bus bars. Further objects of the invention are to provide a bus bar that eliminates the need for separate interconnect terminals, to provide for multiple interconnection capability for multiple styles of connectors with a single component, and to provide for connection of multiple terminals.

SUMMARY OF THE INVENTION

The present invention provides a bus bar with integrated quick-disconnect terminals for distributing electrical current from a power supply or other electronic component. The bus bar and terminals are comprised of a single piece of copper alloy or other suitable electrically and thermally conductive material. The quick-disconnect terminals are blades configured to connect to industry standard receptacles. The bus bar additionally includes integral threaded inserts, threaded studs, or plain holes to provide direct attachment of lugs or other terminals using threaded fasteners, and pins or feet for electrical engagement with power and ground traces on a printed circuit board.

Advantages of the present invention include reduced panel space and volume requirements for the interconnect portion of a power supply or other electronic component incorporating the present invention. The present invention provides for higher electrical performance of the bus bar/interconnect system. Because the connection between the connector and the bus bar is eliminated, resistance is lowered and current capacity is increased. Additionally, the integrated construction provides for improved conduction of heat away from the connector, thereby reducing its operating temperature and allowing a higher current rating for the interconnect. Additional advantages include cost savings by eliminating the need for separate terminal parts, and providing for connection using a variety of different methods without requiring installation of different connectors for each type of application.

A more complete understanding of the high current interconnect and integrated bus bar will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention satisfies the need for more compact, convenient, and cooler operating bus bar with integrated quick-disconnect terminals for distributing electrical current to a power supply or other electronic component. In the detailed description that follows, like element numerals are used to describe like elements illustrated in one or more of the figures.

Figure 1:
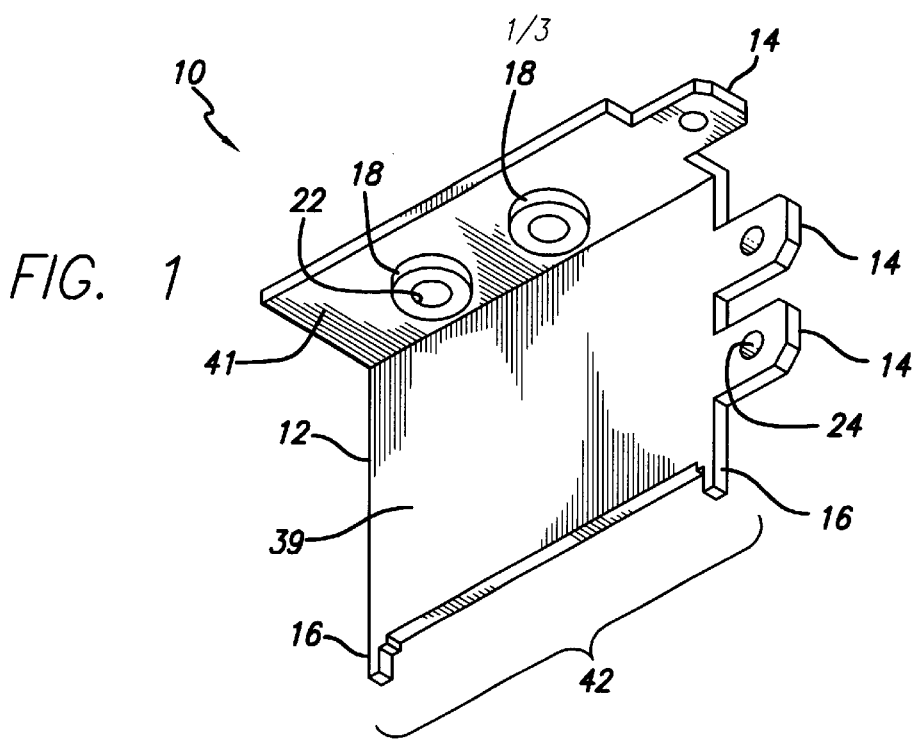
FIG. 1 is a perspective view of an integrated interconnect and bus bar according to the present invention.

FIG. 1 depicts an integrated interconnect and bus bar 10 according to the present invention. The interconnect and bus bar 10 is configured for the distribution of electrical power between a printed circuit board and one or more electrical terminals 14, also called blades. Bar 12 is preferably formed from a single piece of copper alloy and is for carrying electric current between the terminals 14 and an interface portion 42, where the connection to the printed circuit board is made. Bar 12 preferably contains a bend 31 defining a vertical portion 39, and a horizontal portion 41. Portions 39 and 41 are at approximate right angles to each other. Horizontal portion 41 may extend to the right, or to the left of vertical portion 39, depending on whether a right-handed or left-handed variant of interconnect and bus bar 10 is desired. The vertical portion 39 and horizontal portion 41 each preferably include at least one blade 14. Although a total of three blades 14 are shown, interconnect and bus bar 10 can have any number of blades.

Figure 5:
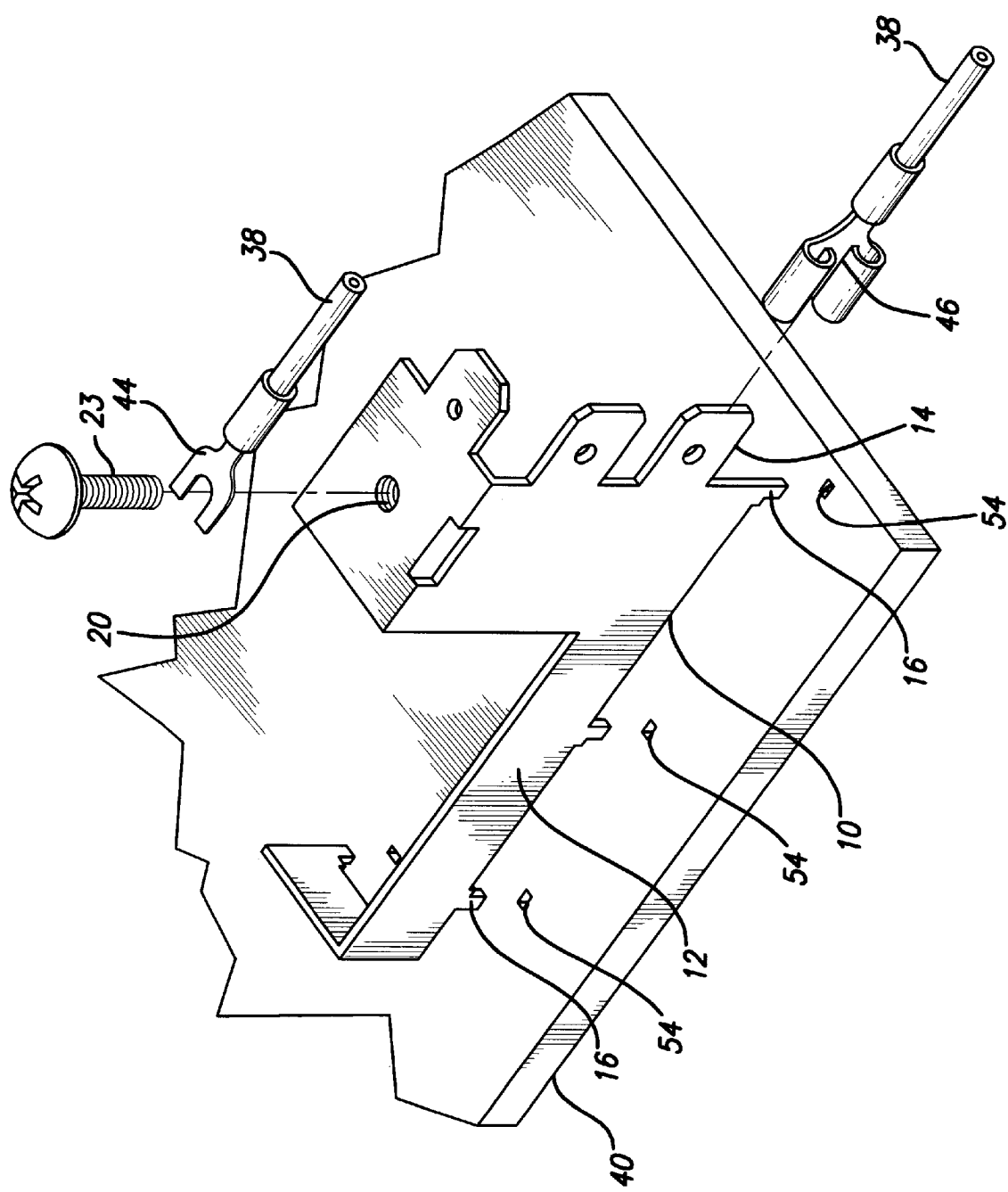
FIG. 5 is an exploded assembly view of an integrated interconnect and bus bar according to the present invention.

Vertical portion 39 preferably extends from the interface portion 42. In FIG. 1, a vertical portion 39 is shown having the same width as the interface portion 42. In a preferred embodiment, shown in FIG. 5, vertical portion 39 and horizontal portion 41 are narrower than interface portion 42. Interface portion 42 is also preferably provided with additional bends, as also shown in FIG. 5, so that a portion of interface portion 42 is at an approximate right angle to vertical portion 39. Various configurations of interface portion 42 allow each bus bar to be attached to the most advantageous point on the power supply to minimize resistance. The embodiment illustrated in FIG. 5 has the advantage of requiring less material to fabricate, and having greater mechanical strength and stability when mounted to a circuit board.

Referring again to FIG. 1, interface portion 42 preferably includes pins 16 configured for insertion into the printed circuit board and connection to a power or ground plane using a solder connection. Pins 16 are designed to collectively carry the full current capacity of the bus bar 12, and are preferably adapted to be inserted and soldered into corresponding holes in a printed circuit board. Pins 16 are preferably provided with a shoulder 32. When pins 16 are inserted into a printed circuit board, shoulders 32 hold bar 12 spaced apart from the printed circuit board for clearance purposes. Additional and or wider pins 16 may be included on bar 12 as required to provide the desired current capacity or to collect current from multiple locations on the printed circuit board. In other configurations not shown, mounting feet for the bus bar may be attached to the printed circuit boards by other means such as screws. In comparison, terminals 14 are dimensionally larger than pins 16 to fit the receptacle of a removable connector. The relatively large size of terminals 14 lowers the contact resistance that is inherent to a removable connection, and also aids in conducting away the heat generated by contact resistance at the connection.

Bar 12 additionally includes through holes 22 in an attachment portion of bar 12 positioned apart from the terminals 14. The attachment portion is preferably located in horizontal portion 41 and provides for attachment of diverse types of terminal connectors using threaded fasteners or nuts. Through holes 22 are provided with one or more integral threaded nuts 18 for making a connection using a threaded fastener. Threaded nuts 18 are selected to fit commonly used threaded fasteners; for example, a 10-32 threaded nut will fit many common fasteners and studs. Threaded nuts 18 are preferably self clinching nuts, such as self-clinching nuts available from Penn Engineering and Manufacturing Corp. in Danboro, Pa., and sold under the trademark PEM™. The self-clinching nuts are preferably made integral with bar 12 by clinching the nut into through hole 22, which is formed with an appropriate diameter for this purpose. Less preferably, threaded nuts 18 are soldered or brazed to bar 12.

Figure 2A:
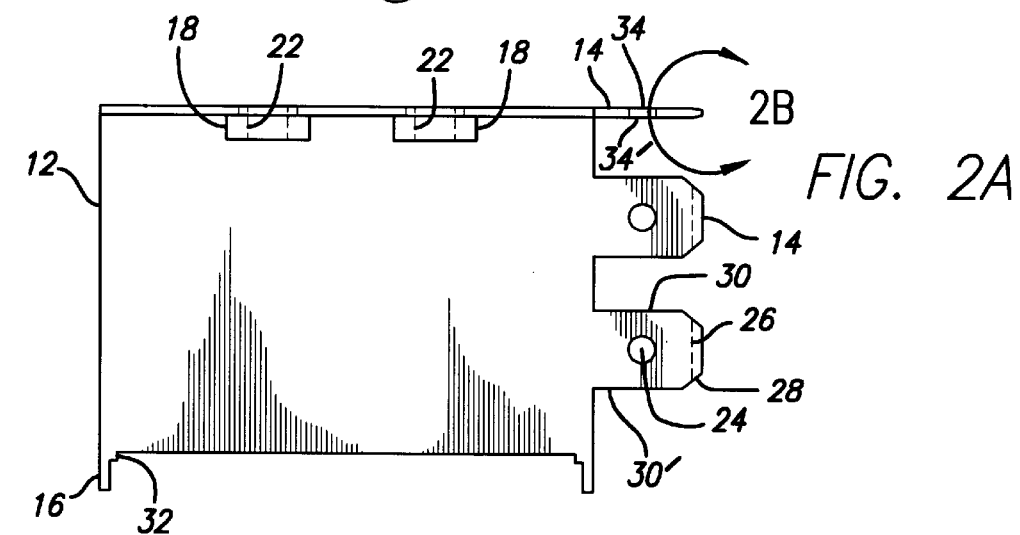
FIG. 2A is a plan view of an integrated interconnect and bus bar according to the present invention.
Figure 2C:
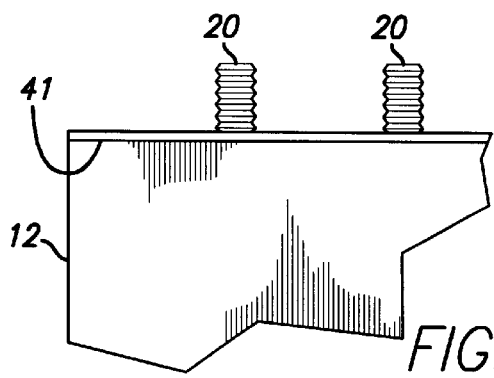
FIG. 2C is a partial side view as shown in FIG. 2A, showing an alternative embodiment with threaded studs for attaching electrical connectors.

In an alternative embodiment, illustrated in FIG. 2C, the attachment portion of bar 12 is provided with one or more integral threaded studs 20 instead of, or in addition to, the threaded nuts. Threaded studs 20 are selected to fit commonly used threaded nuts; for example, a 10-32 thread is typical. Threaded studs 20 are preferably self-clinching studs, such as PEM™ self-clinching studs. The self-clinching studs are preferably made integral with bar 12 by clinching the stud into through hole 22, which is formed with an appropriate diameter for this purpose. Less preferably, threaded studs 18 are soldered or brazed to bar 12. Another alternative embodiment is to provide plain unthreaded holes for the use of other attachment methods.

The threaded nuts, holes, and studs are provided for the convenience of users, in the event a user is not equipped with the proper type of quick-disconnect receptacle for connecting to terminal 14. In such case, the user will be able to connect to threaded insert 20 using other commonly available ring or lug terminals and a threaded fastener or nut. However, it is preferable to use quick-disconnect terminals 14 for ease of connector removal and attachment, and low contact resistance.

Terminals 14 are configured to fit industry standard quick-disconnect receptacles, such as FASTON™ receptacles available from AMP Inc., of Harrisburg, Pa. "Quick-disconnect" is used herein only to describe friction-fit, push-on, pull-off prong or blade male terminals, mating female receptacles, and connections made therewith. Quick-disconnect terminals and receptacles are sold under various trade names and are commercially available from various sources.

As shown in FIG. 2A, terminals 14 are preferably flat blades coextensive with bar 12. Each blade 14 forms a generally rectangular extension from bar 12, has two side edges 30 and 30', and an end edge 26. Each blade 14 is optionally provided with a small through hole 24 as a retention feature.

Figure 2B:
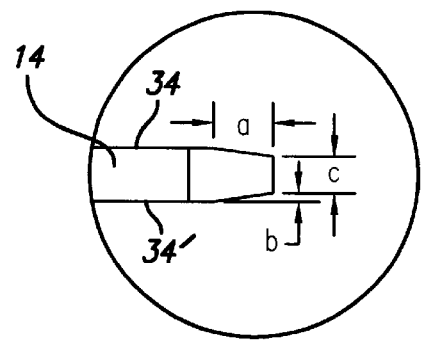
FIG. 2B is an enlarged side view of an interconnect blade, showing dimensional details of the blade profile.

The width of each blade 14 matches an industry standard quick-disconnect connector for power supplies, for example, a width of 0.250 inches would be typical to match commonly used receptacle connectors for electronic power supplies. Similarly, end edge 26 defines the length of blade 14, which for power supply applications is typically 0.312 inches. A chamfer 28 is provided between side edges 30 and 30', and end edge 26. Chamfer 28 may be dimensioned variously, but is preferably a 45°, 0.05 inch chamfer for typical connectors. Faces 34 and 34' of blade 14 are preferably tapered at edge 36 as shown in FIG. 2B. Dimension a is typically 0.030 inches, and dimension b is typically 0.005 inches. Various dimensions and shapes of terminals 14 may be employed with the present invention so long as formed integrally with bar 12 and configured to fit an industry standard quick-disconnect connector.

The thickness of terminals 14, shown as dimension c on FIG. 2B, is preferably the same as the thickness of bar 12, to facilitate stamping or forming bar 12 and terminals 14 out of one piece. For typical connectors, a thickness of 0.032 inches is preferable. In such case, for example, the interconnect and bus bar assembly is preferably formed using techniques known in the art from 0.032 inch thick copper. After the forming operation, bar 12 is preferably plated with tin or other metal for corrosion protection.

Figure 3:
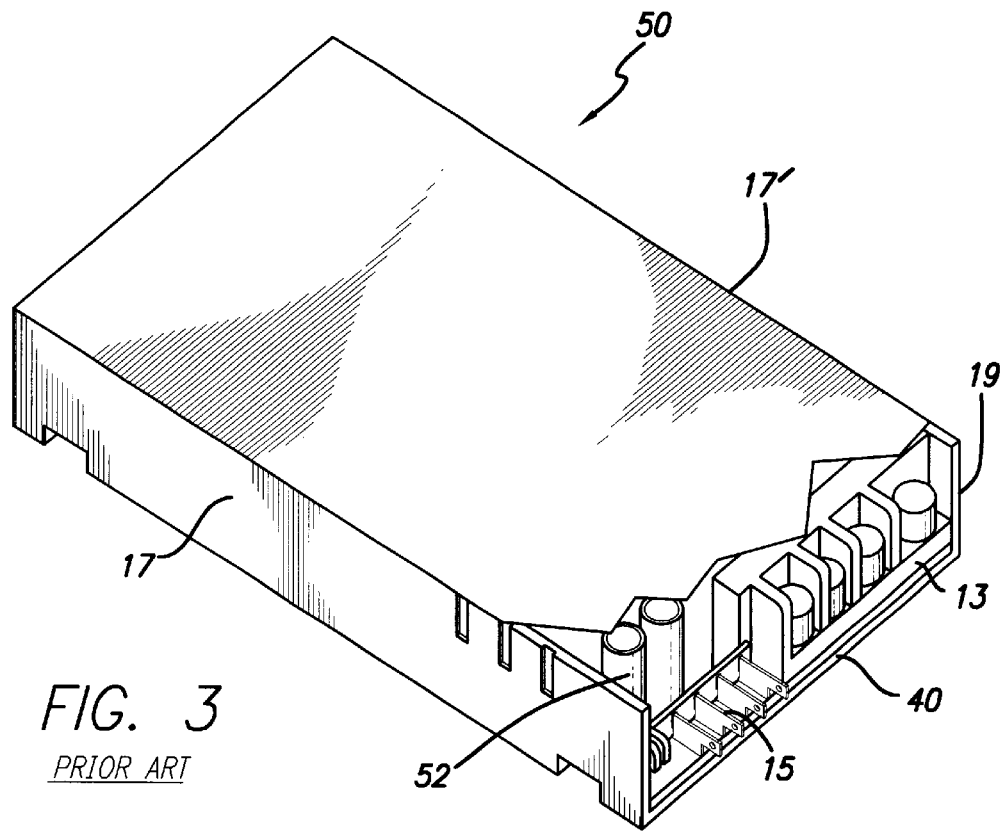
FIG. 3 is a perspective view of a power supply, showing terminal connectors according to the prior art.
Figure 4:
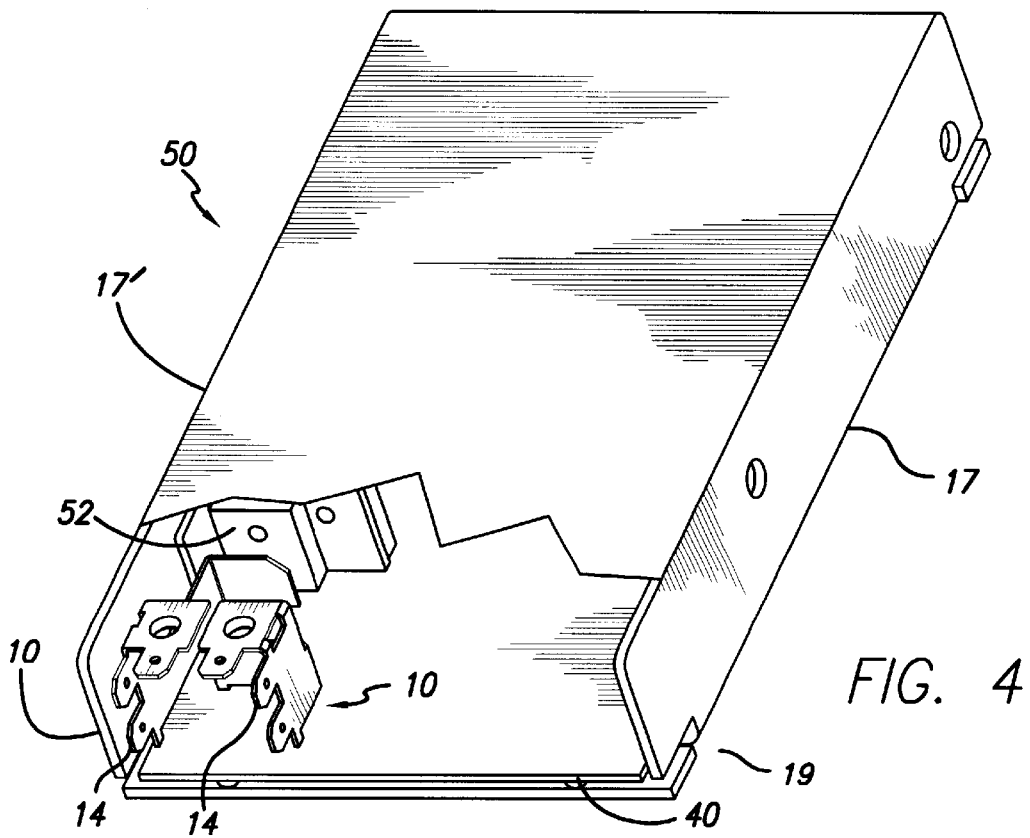
FIG. 4 is a perspective view of a power supply assembly including integrated interconnects and bus bars according to the present invention.

The space-saving advantages of the present invention are immediately apparent from a comparison of FIGS. 3 and 4. FIG. 3 shows a power supply 50 according to the prior art, with terminal block 13 and pin connector 15 for making power connections to other electrical devices. It is apparent that terminal block 13 and flag terminals 15 occupy almost all of the space between the two sidewalls 17 and 17' of chassis 19, leaving less room for other internal components 52 or no room for alternate connectors. In contrast, FIG. 4 illustrates a power supply 50 according to the present invention, having approximately the same physical size as the prior art power supply pictured in FIG. 3. Integrated bus bars 10 are mounted to printed circuit board 40 for making power connections to power supply 50, and occupy only about one-third of the space between sidewalls 17 and 17' of chassis 19. Thus, more area is left open between sidewalls 17 and 17'. This open area can be used to provide more cooling to components 52, for providing additional bus bars to carry more current at the same or different voltages, providing space for signal connectors, or for making the power supply 50 more compact.

Referring again to FIG. 4, power supply 52 comprises a circuit for distributing output electric power, such as direct current at a voltage between 0.5 and 5 volts, which it also converts from an input power, such as alternating current at 100 to 300 volts, according to methods known in the art. Component 52 supplies output power to terminals 14 which are integrally formed with bus bar and interconnect 10.

The integrated bus bars 10 are preferably paired, the pair comprising one left-handed and one right-handed variant. Each member of the pair is preferably positioned as shown in FIG. 4, so that the terminal blades are aligned with the perimeter of a rectangle defined by the horizontal and vertical portions of the paired integrated bus bars 10. One member of the pair is preferably used for providing positive terminals, and is connected to the power plane of the printed circuit board. The other member of the pair is used for negative terminals, and is connected to the ground plane of the printed circuit board. The integrated bus bars 10 are preferably dimensioned so that when they are positioned as described above, a connection can be made to all of their blades simultaneously using a receptacle block (not shown).

Further details of an assembly according to the present invention are shown in FIG. 5. Bus bar and interconnect 10, comprising bus bar 12 and terminals 14, is connected to an output power circuit of the power supply by pins 16 inserted into holes 54 in printed circuit board 40, and soldered in place. Wires 38 may be electrically connected using receptacle connector 46. Wire 38 is crimped to a shank portion of receptacle connector 46, which then is pushed onto terminal blade 14. In the alternative, wire 38 is crimped to a lug, such as a fork lug 44, and connected to bus bar and interconnect 12 using a screw 23, or other threaded fastener.

Having thus described a preferred embodiment of an integrated interconnect and bus bar, it should be apparent to those skilled in the art that certain advantages of the within system have been achieved. It should also be appreciated that various modifications, adaptations, and alternative embodiments thereof may be made within the scope and spirit of the present invention. For example, a interconnect and bus bar for a power supply has been illustrated, but it should be apparent that the inventive concepts described above would be equally applicable to other electronic components. The invention is further defined by the following claims.

What is claimed is:

1. An apparatus for distributing electric current between at least one wire and a printed circuit board, comprising:

a bar comprised of an electrically conductive material, said bar extending in a length direction between a first tab and a second tab, said bar further comprising an interface portion, said interface portion comprising said first tab extending from said bar transverse to said length direction and configured for providing an electrical connection to a printed circuit board, and said second tab extending from said bar transverse to said length direction and configured for attachment to a printed circuit board;

at least one electrical terminal extending an extension distance away from said bar, and positioned adjacent to said second tab apart from said interface portion, said electrical terminal configured to mate with a quick-disconnect connector for providing a quick-disconnect electrical connection to said wire; and a threaded stud extending from said bar and positioned on said bar apart from said interface portion and from said electrical terminal;

wherein said bar is at least about two times longer in said length direction than said extension distance of said at least one electrical terminal.

2. The apparatus of claim 1, wherein said at least one electrical terminal comprises a blade.

3. The apparatus of claim 1, wherein said bar is at least about ten times longer than said extension distance of said at least one electrical terminal.

4. The apparatus of claim 1, further comprising at least one shoulder attached to said bar for holding said bar spaced apart from said printed circuit board when said first tab is connected to said printed circuit board.

5. An apparatus for distributing electric current between at least one wire and a printed circuit board, comprising;
   a bar comprised of an electrically conductive material, said bar extending in a length direction between a first tab and a second tab, said bar further comprising an interface portion, said interface portion comprising said first tab extending from said bar transverse to said length direction and configured for providing an electrical connection to a printed circuit board, and said second tab extending from said bar transverse to said length direction and configured for attachment to a printed circuit board;
   at least one electrical terminal extending an extension distance away from said bar, and positioned adjacent to said second tab apart from said interface portion, said electrical terminal configured to mate with a quick-disconnect connector for providing a quick-disconnect electrical connection to said wire;
   at least one screw attachment portion having a through hole, said screw attachment portion positioned apart from said interface portion and from said electrical terminal; and
   a threaded nut integrally attached at said through hole of said attachment portion;
      wherein said bar is at least about two times longer in said length direction than said extension distance of said at least one electrical terminal.

6. The apparatus of claim 5, wherein said at least one electrical terminal comprises a blade.

7. The apparatus of claim 5, wherein said bar is at least about ten times longer than said extension distance of said at least one electrical terminal.

8. The apparatus of claim 5, further comprising at least one shoulder attached to said bar for holding said bar spaced apart from said printed circuit board when said first tab is connected to said printed circuit board.

9. An electric power supply, comprising:
   a printed circuit board having a circuit for receiving input electric power, modifying selected properties of said input electrical power to produce output electric power, and distributing said output electric power to at least one electrical terminal;
   a bar comprised of an electrically conductive material mounted to said printed circuit board by at least a first tab and a second tab, said first tab and said second tab extending from said bar, said bar electrically connected by at least said first tab to a portion of said circuit distributing said output electric power;
   at least one screw attachment portion having a through hole, said screw attachment portion positioned apart from said blade;
   an integral threaded stud extending from said bar and positioned on said bar apart from said interface portion and from said electrical terminal; and
   at least one electrical terminal extending an extension distance away from said bar, and positioned adjacent to said second tab of said bar apart from said printed circuit board, wherein said terminal is configured to mate with a quick-disconnect connector for providing a quick-disconnect electrical connection to a wire, and said bar extends between said first tab and said second tab for a distance at least about two times longer than said extension distance of said at least one electrical terminal.

10. The apparatus of claim 9, wherein said at least one electrical terminal comprises a blade.

11. The apparatus of claim 9, wherein said bar is at least about ten times longer than said extension distance of said at least one electrical terminal.

12. The apparatus of claim 9, further comprising at least one shoulder attached to said bar for holding said bar spaced apart from said printed circuit board when said first tab is connected to said printed circuit board.

13. An electric power supply, comprising:
   a printed circuit board having a circuit for receiving input electric power, modifying selected properties of said input electrical power to produce output electric power, and distributing said output electric power to at least one electrical terminal;
   a bar comprised of an electrically conductive material mounted to said printed circuit board by at least a first tab and a second tab, said first tab and said second tab extending from said bar, said bar electrically connected by at least said first tab to a portion of said circuit distributing said output electric power;
   at least one screw attachment portion having a through hole, said screw attachment portion positioned apart from said blade;
   an integral threaded nut positioned in said through hole; and
   at least one electrical terminal extending an extension distance away from said bar, and positioned adjacent to said second tab of said bar apart from said printed circuit board, wherein said terminal is configured to mate with a quick-disconnect connector for providing a quick-disconnect electrical connection to a wire, and said bar extends between said first tab and said second tab for a distance at least about two times longer than said extension distance of said at least one electrical terminal.

14. The apparatus of claim 13, wherein said at least one electrical terminal comprises a blade.

15. The apparatus of claim 13, wherein said bar is at least about ten times longer than said extension distance of said at least one electrical terminal.

16. The apparatus of claim 13, further comprising at least one shoulder attached to said bar for holding said bar spaced apart from said printed circuit board when said first tab is connected to said printed circuit board.

17. An electric power supply, comprising:
   a printed circuit board having a circuit for receiving input electric power, converting it to output electric power, and distributing said output electric power to at least one positive electrical terminal;
   a first bar comprised of an electrically conductive material mounted to said printed circuit board by at least a first tab and a second tab extending from said bar, said bar electrically connected by at least said first tab to a positive power portion of said circuit distributing said output electric power;

a second bar comprised of an electrically conductive material mounted to said printed circuit board and electrically connected to a negative power portion of said circuit distributing said output electric power;

at least one positive electrical terminal integral with and extending an extension distance away from said first bar adjacent to said second tab of said first bar, and positioned apart from said printed circuit board, wherein said at least one positive terminal is configured to mate with a quick-disconnect connector for providing a quick-disconnect electrical connection to a first wire;

at least one negative electrical terminal integral with and extending from said second bar, and positioned apart from said printed circuit board, wherein said at least one negative terminal is configured to mate with a quick-disconnect connector for providing a quick-disconnect electrical connection to a second wire; and at least one positive screw attachment portion on said first bar, said positive screw attachment portion positioned apart from said positive electrical terminal and comprising at least one of a threaded nut and a threaded stud, and at least one negative screw attachment portion on said second bar, said negative screw attachment portion positioned apart from said negative electrical terminal and comprising at least one of a threaded nut and a threaded stud;

wherein said first bar extends between said first tab and said second tab for a distance at least about two times longer than said extension distance of said at least one positive electrical terminal.

18. The apparatus of claim 17, wherein said at least one positive electrical terminal further comprises a first blade, and wherein said at least one negative electrical terminal comprises a second blade.

19. An electric power supply, comprising:

a printed circuit board having a circuit for receiving input electric power, converting it to output electric power, and distributing said output electric power to at least one positive electrical terminal;

a first bar comprised of an electrically conductive material mounted to said printed circuit board by at least a first tab and a second tab extending from said bar, said bar electrically connected by at least said first tab to a positive power portion of said circuit distributing said output electric power;

a second bar comprised of an electrically conductive material mounted to said printed circuit board and electrically connected to a negative power portion of said circuit distributing said output electric power;

at least one positive electrical terminal integral with and extending an extension distance away from said first bar adjacent to said second tab of said first bar, and positioned apart from said printed circuit board, wherein said at least one positive terminal is configured to mate with a quick-disconnect connector for providing a quick-disconnect electrical connection to a first wire;

at least one negative electrical terminal integral with and extending from said second bar, and positioned apart from said printed circuit board, wherein said at least one negative terminal is configured to mate with a quick-disconnect connector for providing a quick-disconnect electrical connection to a second wire; and wherein said first bar extends between said first tab and said second tab for a distance at least about two times longer than said extension distance of said at least one positive electrical terminal, and wherein said first bar further comprises a first horizontal portion and a first vertical portion, and said second bar further comprises a second horizontal portion and a second vertical portion, and wherein said first bar and said second bar are paired and positioned so that said first vertical portion, said first horizontal portion, said second horizontal portion, and said second vertical portion together define a rectangle.

20. The electric power supply of claim 19, wherein said positive electrical terminal and said negative electrical terminal are positioned along a perimeter of said rectangle.

21. The apparatus of claim 19, wherein said at least one positive electrical terminal further comprises a first blade, and wherein said at least one negative electrical terminal comprises a second blade.

* * * * *